United States Patent
Gupta et al.

[11] Patent Number: 5,810,937
[45] Date of Patent: Sep. 22, 1998

[54] USING CERAMIC WAFER TO PROTECT SUSCEPTOR DURING CLEANING OF A PROCESSING CHAMBER

[75] Inventors: Anand Gupta, San Jose; Srihari Ponnekanti; Gana A. Rimple, both of Santa Clara; Laxman Murugesh, Fremont, all of Calif.

[73] Assignee: Applied Materials, Inc., Santa Clara, Calif.

[21] Appl. No.: 614,594

[22] Filed: Mar. 13, 1996

[51] Int. Cl.$^6$ .................. B08B 3/12; B08B 7/02; B44C 1/22; C03C 25/06
[52] U.S. Cl. .............. 134/1.2; 134/1.1; 134/1.3; 156/643.1; 156/656.1; 156/646.1; 156/657.1; 156/659.1; 156/345
[58] Field of Search ............... 132/1.1, 1.2, 1.3; 156/643.1, 656.1, 646.1, 657.1, 659.11, 345

[56] References Cited

U.S. PATENT DOCUMENTS

| | | | |
|---|---|---|---|
| 4,786,352 | 11/1988 | Benzing | 156/345 |
| 5,024,748 | 6/1991 | Fujimura | 204/298.3 |
| 5,041,311 | 8/1991 | Tsukune et al. | 427/255.3 |
| 5,098,245 | 3/1992 | Toro-Lira et al. | 414/217 |
| 5,240,555 | 8/1993 | Kilburn | 156/643 |
| 5,269,881 | 12/1993 | Sekiya et al. | 156/643 |
| 5,304,248 | 4/1994 | Cheng et al. | 118/728 |
| 5,366,585 | 11/1994 | Robertson et al. | 156/643 |
| 5,405,491 | 4/1995 | Shahvandi et al. | 156/643 |
| 5,558,717 | 9/1996 | Zhao et al. | 118/715 |

FOREIGN PATENT DOCUMENTS 43-12248  8/1965  Japan.

*Primary Examiner*—Lynette F. Smith
*Assistant Examiner*—Brett Nelson
*Attorney, Agent, or Firm*—Townsend & Townsend & Crew LLP

[57] ABSTRACT

A method and apparatus for protecting a susceptor during a cleaning operation by loading a ceramic wafer onto the susceptor before introducing the cleaning agent into the chamber is provided. In particular, the ceramic wafer is chosen to have a dielectric value sufficient to alter the electromagnetic field of a plasma to spread the plasma away from the susceptor during a cleaning operation, directing more of the plasma towards the walls of the chamber.

15 Claims, 3 Drawing Sheets

5,810,937

USING CERAMIC WAFER TO PROTECT SUSCEPTOR DURING CLEANING OF A PROCESSING CHAMBER

BACKGROUND OF THE INVENTION

The present invention relates to methods and apparatus for cleaning a chemical vapor deposition (CVD) chamber.

During CVD processing, the reactant gases can create compositions which deposit upon the inside surfaces of the chamber. As these deposits build up, the residues can flake off and contaminate future processing steps. Such residue deposits can also adversely affect other processing conditions such as deposition uniformity, deposition rate, film strength and the like.

Accordingly, processing chambers are typically periodically cleaned to remove the residue material. Typically, the use of etching gases is used to clean the chamber after each process or after a few processes are run through the chamber. After longer periods of time, typically 1000–2000 wafers, the chamber is opened up and cleaned by hand using rinse water and clean wipes. Clearly, it is desirable to minimize the amount of cleaning time required in order to improve the throughput of wafers through the processing chamber.

The cleaning using the cleaning gases typically involves a plasma enhanced dry cleaning technique. These techniques require a separate process step which requires introducing the cleaning gases into the chamber, striking a plasma from the cleaning gases, and using the plasma to remove contaminant residues. Typically, fluorine is used as a cleaning gas species. Descriptions of such a cleaning process may be found, for instance, in U.S. Pat. Nos. 4,960,488 and 5,124,958, assigned to Applied Materials, Inc.

A disadvantage of the dry cleaning operation is that it contributes to the degradation of the susceptor, which is typically made of aluminum. A susceptor typically has an anodized layer on its surface, which forms some protection. However, during a plasma cleaning process, the fluorine chemistry of the process will penetrate the anodized layer and cause the formation of aluminum fluoride. This usually occurs at point defect sites in the anodized layer on the susceptor. The formation of aluminum fluoride results in formation of nodules, cracks and delamination which, in turn, causes uniformity and particle problems on wafers subsequently placed on the susceptor.

One method for addressing the above degradation of a susceptor is to use a two step cleaning process, as set forth in U.S. Pat. No. 5,158,644, assigned to Applied Materials, Inc. In that two step process, the chamber is first cleaned in an extended state in which the susceptor is lowered to be well spaced from the gas discharge manifold, thus limiting the amount of plasma reaching the susceptor by decreasing the plasma due to the distance between the susceptor and the gas discharge head. With this configuration, the plasma will be somewhat redirected to the grounded walls of the chamber to effect cleaning there. In a second step, the susceptor is moved back up close to the gas discharge head for cleaning of the susceptor itself. The two step process reduces the amount of time the susceptor is exposed to a high intensity plasma.

SUMMARY OF THE INVENTION

The present invention provides a method and apparatus for protecting a susceptor during a cleaning operation by loading a ceramic wafer onto the susceptor before introducing the cleaning agent into the chamber. In particular, the ceramic wafer is chosen to have a dielectric value sufficient to alter the electromagnetic field to spread the plasma away from the susceptor during a cleaning operation, directing more of the plasma towards the walls of the chamber.

The introduction of the ceramic wafer into the chamber has a negative impact on the wafer throughput by adding the time required to load the ceramic wafer and then unload after the cleaning process. However, the redirecting of the plasma with the ceramic wafer reduces the cleaning time itself, more than making up for the amount of time required for handling of the ceramic wafer. The use of the present invention increases the lifetime of a susceptor, decreasing the number of times the susceptor has to be replaced, thereby reducing down time of a chamber, and thereby increasing wafer throughput.

For a fuller understanding of the objects and advantages of the invention, reference should be made to the ensuing detailed description taken in conjunction with the accompanying drawings.

DESCRIPTION OF THE SPECIFIC EMBODIMENT

Figure 1:
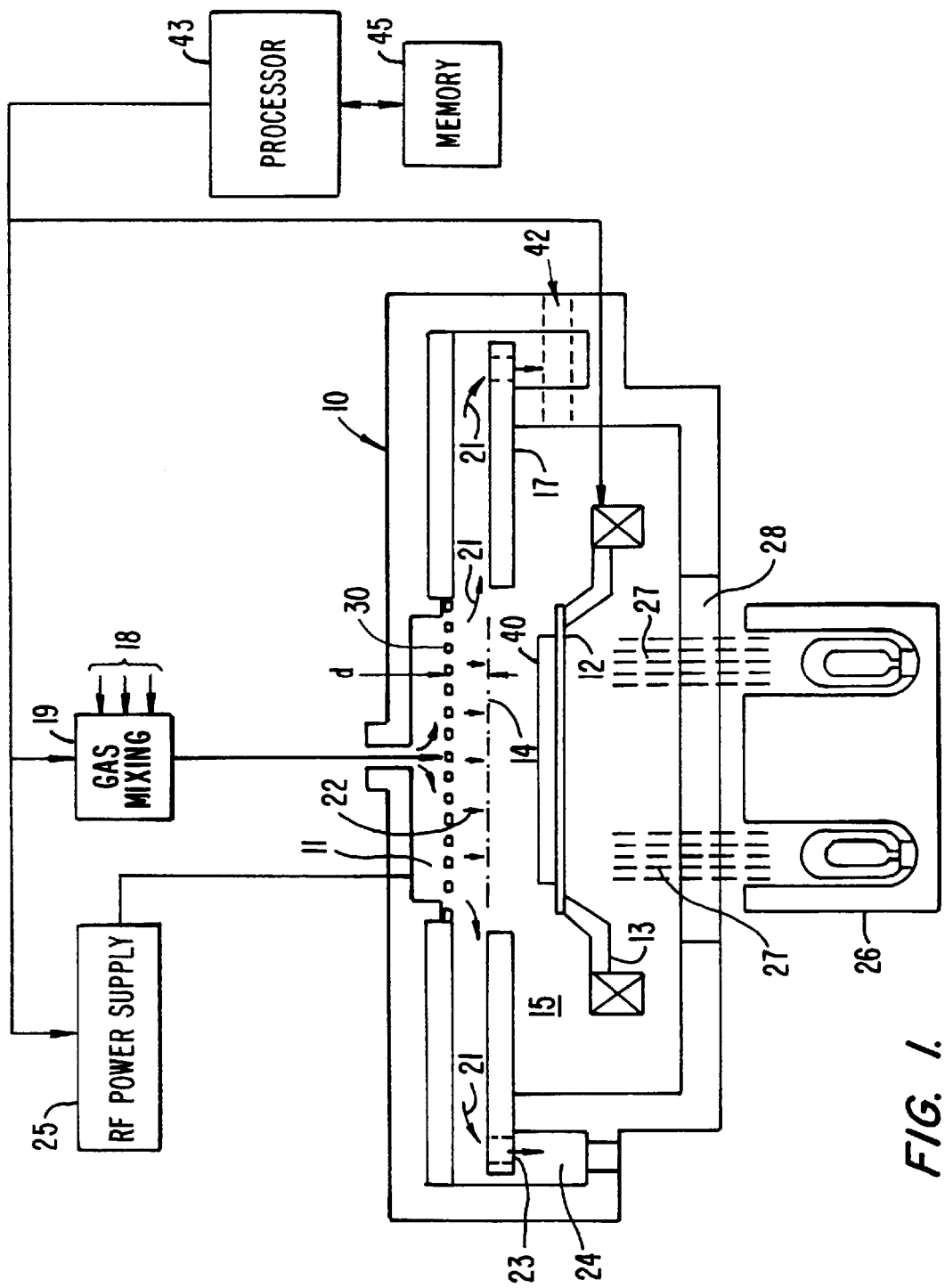
FIG. 1 is a sectional diagram of a processing chamber including the ceramic wafer of the present invention.

One suitable CVD machine in which the method of the present invention can be carried out in is shown in FIG. 1 which is a vertical, cross-sectional view of a simplified, parallel plate chemical vapor deposition reactor 10 having a vacuum chamber 15. Reactor 10 contains a gas inlet manifold 11 for dispersing deposition gases to a wafer that rests on a susceptor 12. Susceptor 12 is highly thermally responsive and is mounted on a support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. During processing, gas inlet to manifold 11 is uniformly distributed radially across the surface of the wafer as indicated by arrows 21. The gas is then exhausted via ports 23 into the circular vacuum manifold 24 by a vacuum pump system (not shown). Before reaching manifold 11, deposition and carrier gases are input through gas lines 18 into a mixing chamber 19 where they are combined and then sent to manifold 11.

The deposition process performed in reactor 10 can be either a thermal process or a plasma enhanced process. In a plasma process, a controlled plasma is formed adjacent to the wafer by RF energy applied to inlet manifold 11 from RF power supply 25. Inlet manifold 11 is also an RF electrode, while susceptor 12 is grounded. RF power supply 25 can supply either single or dual frequency RF power to manifold 11 to enhance the decomposition of reactive species introduced into chamber 15.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

Typically, any or all of the chamber lining, gas inlet manifold faceplate, support fingers 13, and various other reactor hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention, which is incorporated herein by reference for all purposes.

A ceramic wafer 40 is shown placed on susceptor 12. This will protect susceptor 12 from fluorine gases injected into the chamber through gas mixer 19 during a cleaning operation. The ceramic wafer acts as a dielectric, limiting the RF field between manifold 11 and susceptor 12, thus spreading the plasma and redirecting the plasma towards the walls of the chamber and other aspects of the chamber which need to be cleaned. It has been observed in experimental results that this spreading effect reduces the needed cleaning time by 50%.

A processor 43 under the control of a program stored in a memory 45 controls the operation of the chamber of FIG. 1, including the RF power supply 25, the gas mixing system 19, and the raising and lowering of susceptor 12. The processor can also control the insertion and removal of the ceramic wafer via the apparatus shown in FIG. 2.

Figure 2:
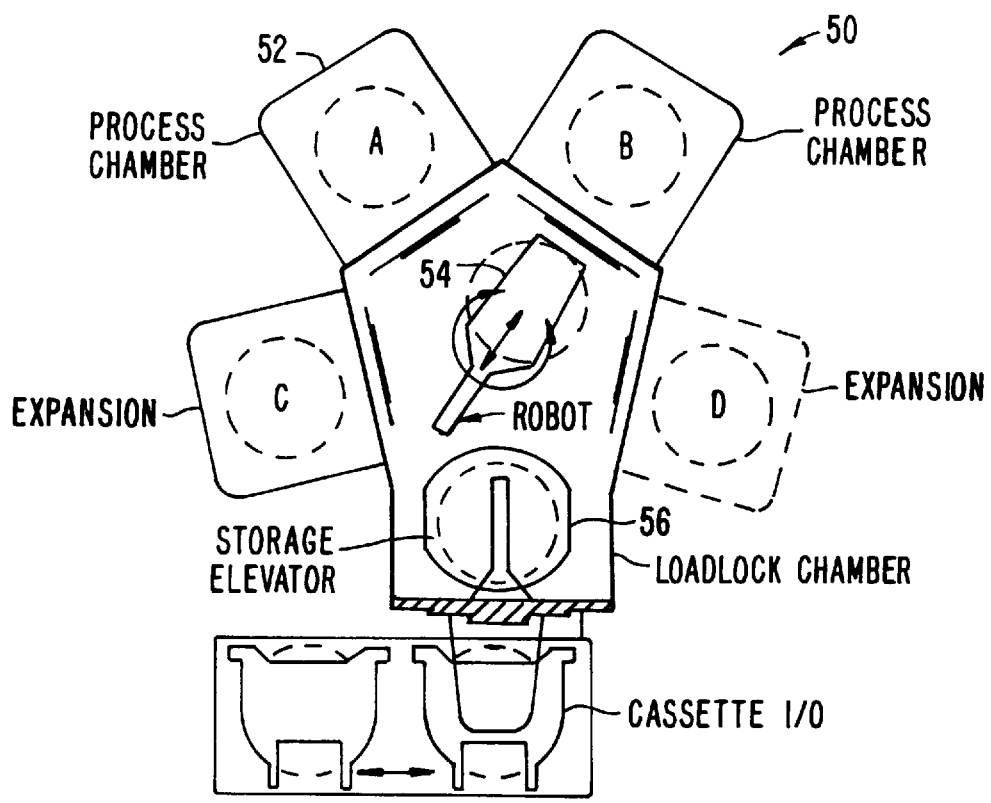
FIG. 2 is a diagram illustrating the robot and wafer storage elevator for handling the ceramic wafer of the present invention.

FIG. 2 shows a diagram of the apparatus for loading the ceramic wafer of the present invention and storing it between uses. FIG. 2 shows a processing system 50 which includes a process chamber 52, such as the one shown in FIG. 1. A robot arm 54 is used to load a ceramic wafer from a storage elevator 56. Storage elevator 56 holds a number of wafers in-between process steps, and can also be used to hold the ceramic wafer of the present invention. The wafer is transferred by the robot arm 54 between process chamber 52 and storage elevator 56.

Figure 3:
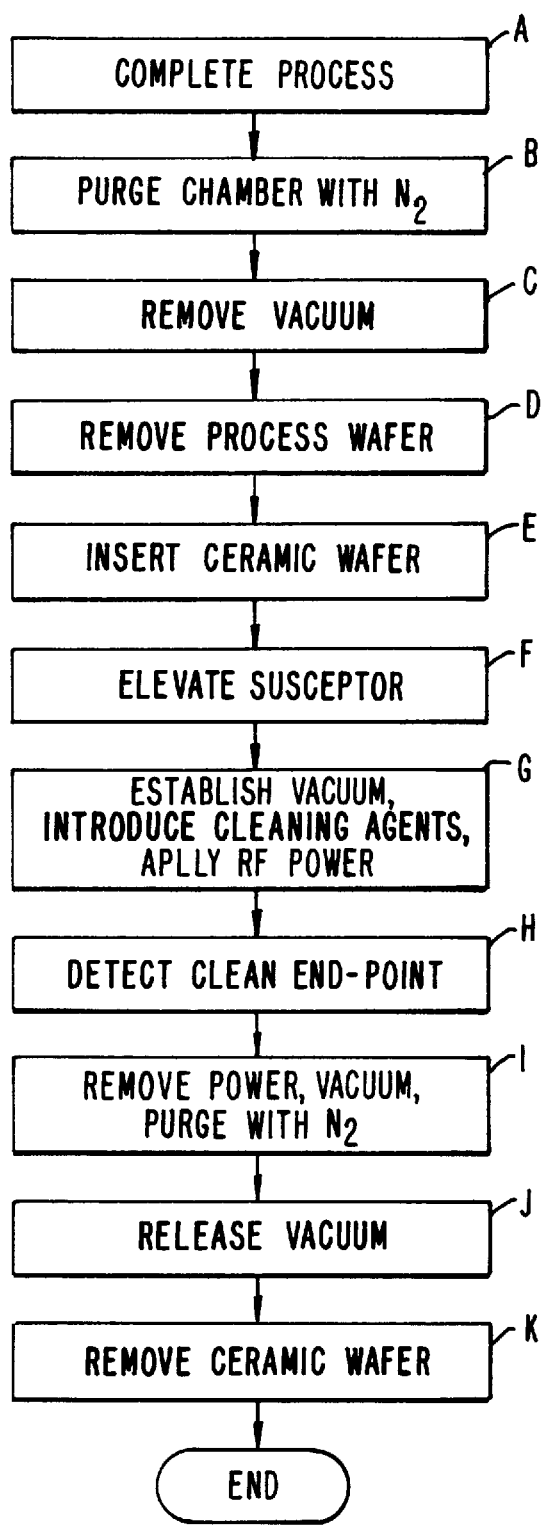
FIG. 3 is a flowchart illustrating the cleaning process of the present invention.

FIG. 3 is a flowchart illustrating the steps of the cleaning operation according to the present invention. These steps may be controlled by processor 43 pursuant to a program in memory 45. After a final processing step on a wafer being processed is completed and the RF power is turned off by a command from processor 43 to RF Power Supply 25 (step A), the chamber is purged with an inert gas, such as nitrogen, by control of appropriate valves in gas mixing system 19 in response to a command from processor 43 (step B). After the last of the purge gases has been removed by the vacuum pump, the vacuum is turned off by controlling a vacuum valve with processor 43 (step C) and the wafer is removed from the chamber (step D) by robot 54 in response to a command from the processor and placed in storage elevator 56.

A ceramic wafer 40 is then retrieved from storage elevator 56 by robot arm 54 and placed into chamber 52 (step E). The wafer is inserted through a slot 42 in the side of the chamber of FIG. 1. The susceptor is then elevated to the desired height for the cleaning plasma by a motor controlled by the processor (step F) and the cleaning agents, typically including fluorine, are introduced into the chamber (step G) under the appropriate pressure and temperature conditions, as directed by commands from the processor to the gas mixing system, vacuum throttle valve and susceptor heater.

An end point detector for detecting light emissions from fluorine gas is used to determine the end of the cleaning operation (step H). Alternately, a timed clean could be used. After the clean has been completed and the RF power turned off, again, an inert gas, such as nitrogen, is used to purge the chamber (step I). The vacuum is turned off (step J) and then the ceramic wafer is removed from the chamber (step K).

The cleaning process can be varied in a number of ways while still using the concepts of the present invention. For instance, a two step process could be used as set forth in U.S. Pat. No. 5,158,644, the disclosure of which is incorporated herein by reference. In such a two step process, the susceptor is in the lowered position with the ceramic wafer and subject to a first cleaning operation. Subsequently, the ceramic wafer is removed, with the susceptor being raised closer to the gas discharge head for a second, local cleaning operation. In one embodiment, the two step cleaning process might be utilized only for periodic cleans, with a single step process being used for most of the cleans, or vice versa.

The thickness and dielectric constant of the ceramic wafer can be varied in accordance with the chamber to be cleaned. In particular, if the chamber walls are covered with a ceramic liner, such as than set forth in U.S. Pat. No. 5,366,585, assigned to Applied Materials, Inc., the ceramic will need to be thicker, or have a lower dielectric constant, than a ceramic wafer used for an unlined chamber. This is because the ceramic liner directs the plasma away from the walls in such a lined chamber, and accordingly the ceramic wafer needs to be thicker or have a lower dielectric constant to redirect the plasma back to the walls, overcoming the insulating feature of the ceramic liner.

In the preferred embodiment, the ceramic wafer is 40 mils thick alumina ($Al_2O_3$), and has a diameter equal to that of the wafers being processed. For instance, if 8" wafers are being processed, an 8" ceramic wafer will be used.

Preferably, the ceramic wafer of the present invention is itself periodically replaced or cleaned to avoid its introducing contaminants into the chamber during the cleaning process due to residue build up on the ceramic wafer. However, thousands of cleaning operations can be performed without such a wafer cleaning or replacement being necessary.

As will be understood by those of skill in the art, the present invention may be embodied in other specific forms without departing from the spirit or essential characteristics thereof. For example, a wafer which is only partially ceramic, has a ceramic coating, or has some other alloy or material which has dielectric properties similar to ceramic could be used. The dielectric constant of the ceramic wafer and its thickness could be varied not only in accordance with the chamber characteristics, but also with the height of the susceptor used during the plasma cleaning process. Although the described embodiment is a CVD chamber, the invention could apply to any chamber where deposits build up, such as an etching chamber, for example. Accordingly, the above embodiments are meant to be illustrative of the present invention, but reference should be made to the ensuing claims which set forth the scope of the present invention.

What is claimed is:

1. A method for cleaning a semiconductor processing chamber including a susceptor for supporting wafers, comprising steps of:

(a) loading a wafer onto said susceptor;

(b) flowing a cleaning gas into said chamber; and (c) forming a plasma in said chamber from said cleaning gas, wherein said wafer has a dielectric constant that causes said plasma in said chamber to spread to a greater degree than said plasma would spread without said wafer.

2. The method of claim 1 wherein said wafer directs said plasma away from said susceptor and toward walls of said chamber.

3. The method of claim 1 wherein said chamber includes walls lined with a ceramic liner, and further comprising a step of selecting said wafer to have a dielectric constant sufficient to direct said plasma toward said ceramic liner.

4. The method of claim 3 wherein said chamber further includes a ceramic shield over said susceptor, and further comprising a step of selecting said wafer to have a dielectric constant, which, when combined with a second dielectric constant of said ceramic shield, directs said plasma toward said ceramic liner.

5. The method of claim 1 wherein said susceptor comprises aluminum and said cleaning gas comprises fluorine.

6. The method of claim 1 further comprising a step of unloading said wafer from said susceptor wherein a first time period required to clean said chamber, including said step (a) of loading said wafer and said step of unloading said wafer, is less than a second time period, said second time period being required to clean said chamber using a similar cleaning process without said wafer.

7. The method of claim 1 wherein said wafer comprises $Al_2O_3$.

8. The method of claim 1 further comprising a step of storing said wafer in a wafer elevator adjacent to said chamber prior to said step (a) of loading said wafer onto said susceptor, and a step of transferring said wafer from said wafer elevator to said processing chamber by a robot arm.

9. The method of claim 1 further comprising the steps of:

setting said susceptor a first distance from a gas discharge head after the step (a) of loading said wafer onto said susceptor;

removing said wafer from said processing chamber after said step (c) of forming a plasma; and setting said susceptor a second distance from said gas discharge head, said second distance being less than said first distance.

10. A method for cleaning a chemical vapor deposition chamber including a susceptor for supporting wafers, said method comprising the steps of:

selecting a ceramic wafer;

loading said ceramic wafer onto said susceptor;

flowing a cleaning gas including fluorine into said chamber; and forming a plasma between a gas discharge head and said susceptor and walls of said chamber, wherein said ceramic wafer has a dielectric constant sufficient to spread said plasma in said chamber toward said walls of said chamber to efficiently clean said walls of said chamber.

11. The method of claim 7 wherein said wafer is about 40 mils thick.

12. The method of claim 1 wherein said wafer has a diameter essentially equal to a process-wafer diameter.

13. The method of claim 1 wherein said dielectric constant is less than about 12.

14. The method of claim 1 wherein said wafer has a selected thickness chosen according to whether said chamber is lined or unlined with a ceramic liner, said selected thickness being greater for a lined chamber than for an unlined chamber.

15. The method of claim 10 wherein said wafer has a selected thickness chosen according to whether said chamber is lined or unlined with a ceramic liner, said selected thickness being greater for a lined chamber than for an unlined chamber.

\* \* \* \* \*